Figure 1:
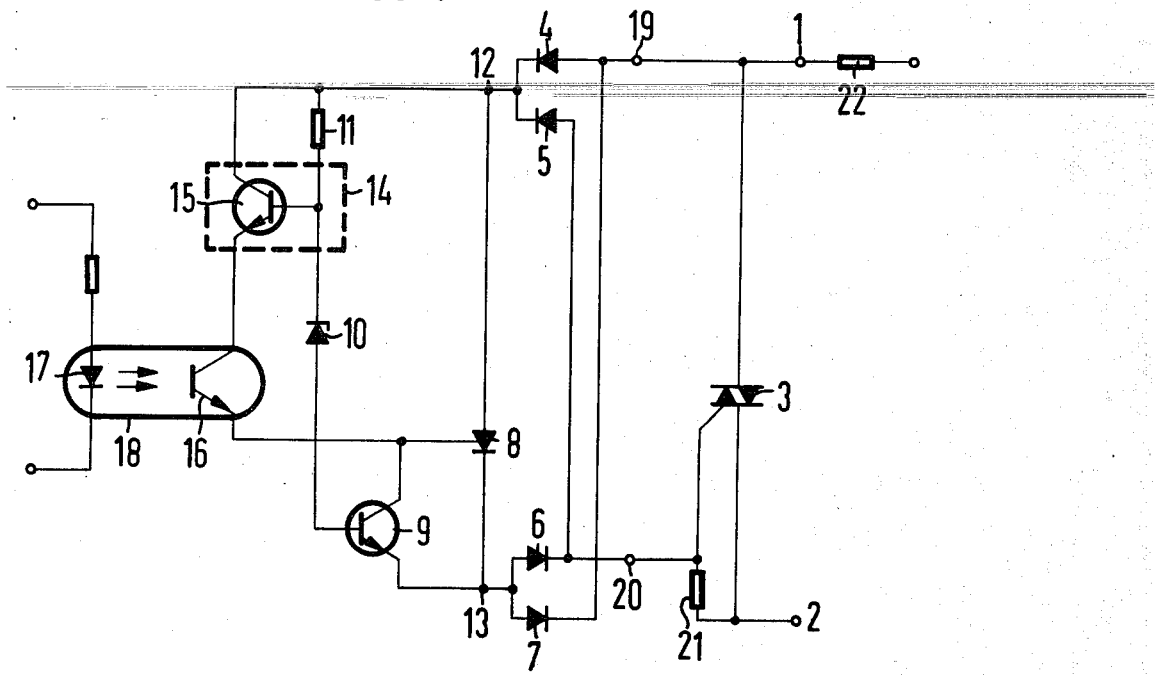

United States Patent [19]

Stut

[11] 4,324,989
[45] Apr. 13, 1982

[54] SOLID-STATE RELAY

[75] Inventor: Hans Stut, Gröbenzell, Fed. Rep. of Germany

[73] Assignee: Siemens Aktiengesellschaft, Berlin and Munich, Fed. Rep. of Germany

[21] Appl. No.: 58,466

[22] Filed: Jul. 18, 1979

[30] Foreign Application Priority Data

Jul. 21, 1978 [DE] Fed. Rep. of Germany ....... 2832193

[51] Int. Cl.³ .............................................. H03K 17/72
[52] U.S. Cl. ............................. 307/252 J; 307/252 B; 307/252 UA
[58] Field of Search ............ 307/252 B, 252 J, 252 N, 307/252 T, 252 UA, 252 W, 318, 305, 311; 323/225 C

[56] References Cited

U.S. PATENT DOCUMENTS

| | | | |
|---|---|---|---|
| 3,668,422 | 6/1972 | Pascente | 307/252 B |
| 3,723,769 | 3/1973 | Collins | 307/252 UA |
| 3,881,118 | 4/1975 | Forrest et al. | 307/252 UA |
| 4,158,150 | 6/1979 | Dever | 307/252 B |

Primary Examiner—John Zazworsky
Attorney, Agent, or Firm—Herbert L. Lerner

[57] ABSTRACT

Solid-state relay, including a full-wave rectifier bridge having a first and a second d-c terminal, a thyristor having the anode thereof connected to the first terminal and the cathode thereof connected to the second terminal, a first transistor having a load circuit and a control terminal, the load circuit of the first transistor being connected to the gate and the cathode of the thyristor and the control terminal of the first transistor being connected to at least one resistor which is in turn connected to the first terminal, a second transistor having means for supplying a control current thereto and having a load circuit, a Zener diode, and a current amplifier having an input and two input terminals, one input terminal being connected to the Zener diode which is in turn connected to the control terminal of the first transistor and the other input terminal being connected through the load circuit of the second transistor to the gate terminal of the thyristor, the current amplifier having an output and two output terminals, one output terminal being connected to the first terminal through a resistor and the other output terminal being connected to the first terminal.

4 Claims, 2 Drawing Figures

SOLID-STATE RELAY

The invention relates to a solid-state relay with a full-wave rectifier bridge and a thyristor, the anode and cathode of which are connected to respective d-c terminals of the bridge, comprising a first transistor, the load circuit of which is shunted across the base-cathode path of the thyristor and the control terminal of which is connected through at least one resistor to the d-c terminal which is connected to the anode of the thyristor; and a second transistor which can be controlled by a control voltage, and controls the control current for the thyristor.

A solid-state relay of this basic type has already been described heretofore. In this prior art circuit the transistor shunted across the gate-cathode path of the thyristor is controlled through a voltage divider connected to the d-c terminals of the bridge in accordance with the waveform of the rectified voltage. The gate-cathode path of the thyristor is shunted accordingly, and the thyristor cannot fire if the second transistor does not conduct. If the second transistor is switched into conduction by a control voltage, the current required for driving the first transistor is derived. Therefore, a third transistor, the collector-emitter path of which is connected parallel to the gate-cathode path of the thyristor, is cut off. The base electrode of the thyristor then receives control current and the thyristor can fire. If the rectified voltage is already too high when the second transistor is switched on, then the thyristor can no longer be fired, since the third transistor also conducts if no control signal is applied as soon as the rectified voltage exceeds a certain value. It is thereby ensured that the thyristor will be fired only if the rectified voltage deviates only slightly from zero, i.e., in the vicinity of the zero crossing of the a-c voltage to be switched.

In the circuit heretofore-known, two transistors connected parallel to the gate-cathode path of the thyristor are therefore required in order to switch the thyristor into conduction. This means that, in the off-state of the solid-state relay, current flows through at least one of the transistors. Since the thyristor must also fire at a voltage which deviates only slightly from zero, for instance, at 10 V, the solid-state relay must be constructed in such a way that a quiescent current flows in the "off" state. The peak current thereof being about 10- to 20- times the control value for the thyristor. With a firing current of, say, 1 mA, a quiescent current due to the circuit concept of 10 to 20 mA therefore flows through the relay and thus through the load.

In many cases, this quiescent current is too large. It is accordingly an object of the invention to provide an electronic relay which overcomes the hereinafore mentioned disadvantages of the heretofore known devices of this general type and in which a considerably smaller quiescent current flows.

With the foregoing and other objects in view, there is provided, in accordance with the invention, a solid-state, relay, comprising a full-wave rectifier bridge having a first and a second d-c terminal, a thyristor having the anode thereof connected to the first terminal and the cathode thereof connected to the second terminal, a first transistor having the load circuit thereof shunted across the gate-cathode path of the thyristor and the control terminal thereof connected to at least one resistor which is in turn connected to the first terminal, a second transistor having means for supplying a control voltage thereto, a current amplifier having an input connected to the first terminal through the at least one resistor and to a Zener diode which is in turn connected to the control terminal of the first transistor, the current amplifier having an output connected to the first terminal and to the load circuit of the second transistor which is in turn connected to the control input of the thyristor.

In accordance with another feature of the invention, the current amplifier is a further transistor connected in a collector-base circuit.

In accordance with a further feature of the invention, for higher line voltages, the current amplifier comprises at least two additional transistors, the collector-emitter paths of the additional transistor being connected in series with each other and the additional transistors being connected in a collector-base circuit, and a resistor connected between the base terminals of the additional transistors.

In accordance with a concomitant feature of the invention, the second transistor which can be controlled by an external control input and the supplying means are parts of an opto-electronic coupler. Other features which are considered as characteristic for the invention are set forth in the appended claims.

Although the invention is illustrated and described herein as embodied in Solid-State Relay, it is nevertheless not intended to be limited to the details shown, since various modifications and structural changes may be made therein without departing from the spirit of the invention and within the scope and range of equivalents of the claims.

Figure 2:
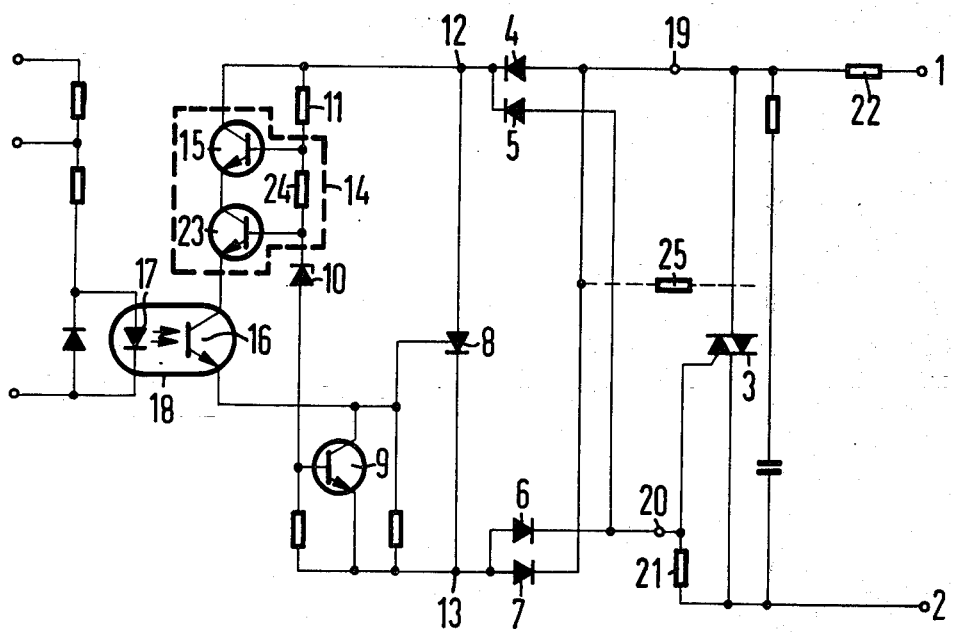

The construction and method of operation of the invention, however, together with additional objects and advantages thereof will be best understood from the following description of specific embodiments when read in connection with the accompanying drawings, in which:

FIG. 1 is a schematic circuit diagram employing the solid-state relay in accordance with a first embodiment of the invention; and FIG. 2 is a diagram similar to FIG. 1, showing a second embodiment of the invention.

Referring now to the figures of the drawing and first, particularly, to FIG. 1 thereof, there is seen a solid-state relay having two a-c terminals 1,2. The relay is connected to an a-c voltage source through a load 22. A bidirectional switch, for instance a Triac 3, is connected between the terminals 1,2. Two antiparallel-connected thyristors may also be used instead of a triac. Terminal 1 is connected directly to a full-wave rectifier bridge, and terminal 2 is connected to the bridge through a resistor 21. The rectifier bridge includes diodes 4,5,6,7. The control electrode of the Triac 3 is connected to the terminal 2 through the resistor 21.

The bridge has first and second d-c terminals 12,13, to which the anode and cathode, respectively, of a thyristor 8 are connected. If the thyristor 8 is switched into conduction, a current flows through the load 22, the terminal 1, the diodes 4 or 5, the thyristor 8 and the diodes 6 or 7 into the control terminal of the Triac 3, and switches the latter into conduction. The load current then flows through the load 22, the terminal 1 and the Triac 3 to the terminal 2 and vice versa.

The load circuit (collector-emitter path) of a first transistor 9 is connected parallel to the gate-cathode path of the thyristor 8. The base or control terminal of the first transistor 9 is connected through a Zener diode 10 to the input of a current amplifier 14, which in turn is connected through a resistor 11 to the first d-c terminal 12. The control terminal of the thyristor 8 is further connected through the load circuit of a second transistor 16 to the output of the current amplifier 14. The current amplifier 14, on the other hand, is likewise connected to the first d-c terminal 12. In the embodiment shown, the current amplifier 14 is a further transistor 15, having a base terminal which forms a shared input and output terminal of the amplifier.

The operation of the solid-state relay is characterized by three states or modes of operation:

1. The second transistor 16 is not driven, i.e., it is cut-off, and the voltage present at the terminals 1,2 is so high that the relay must not be switched on. Therefore, no current flows through the transistor 15 of the current amplifier 14. However, the rectified current flows through the resistor 11 and the Zener diode 10 into the base of the transistor 9 and switches the latter into conduction. The voltage, at which the first transistor 9 is switched into conduction, is determined by the Zener voltage of the Zener diode 10. The gate-cathode path of the thyristor 8 is short-circuited if the Zener voltage is exceeded and the thyristor 8 cannot fire. The solid-state relay therefor remains switched off.

2. The second transistor 16 is switched on by an external control input and the rectified voltage has a magnitude at which the solid-state relay can still be switched on. Therefore, a current flows from the first d-c terminal 12 through the resistor 11 into the transistor 15 and switches the latter into conduction. Then the current flows through the collector-emitter path of the transistor 15 and through the collector-emitter path of the second transistor 16 to the gate terminal of the thyristor 8. If the Zener voltage of the Zener diode 10 is not yet reached and the first transistor 9 is thereby cut off, the thyristor 8 is fired. Thus, a current flows through the thyristor 8 and switches the Triac 3 into conduction in the manner described above. The relay is therefore switched on.

3. The second transistor 16 is assumed to have been switched into conduction by an external input and the magnitude of the rectified voltage to be such that the relay must no longer be switched on; i.e., it is above the Zener voltage of the Zener diode 10. Then a current flows from the first terminal 12 through the resistor 11 into the transistor 15, the second transistor 16 and through the Zener diode 10. This current switches the first transistor 9 into conduction, whereby the gate-cathode path of the thyristor 8 is short-circuited and is not fired. Firing can then be initiated only in the vicinity of the crest voltage zero crossing.

The resistor 11 is chosen so that the current flowing through it is sufficient for driving the transistor 15. It may have, for instance, a resistance of 180 kOhms. If an a-c voltage of, say, 220 V is applied, a current of the order of 2 mA peak then flows through the resistor 11. This is the quiescent current of the solid-state relay in the off state. Since the transistor 15 operates as a current amplifier with a current gain of between 50 and 200, 50-to 200-times the current flowing through the resistor 11 is therefore available as the firing current for the thyristor 8. Thus, sufficient firing current is already supplied at a rectified voltage which is close to the zero crossing of this voltage, for instance, about 10 V.

The second transistor 16 can be part of an opto-electronic coupler 18 and can be mounted with a light-emitting diode 17 in a common housing. However, if d-c potential separation is desired, the means for controlling the second transistor 16 can also be driven by a transformer or otherwise.

In FIG. 2, a somewhat modified circuit construction is shown. Like parts or parts with like function are provided with the same reference symbols as in the embodiment of FIG. 1. The essential difference is that in the circuit of FIG. 2, the current amplifier 14 includes two additional transistors 15, 23 which are operated in a base-collector circuit and the load circuits of which are connected in series. The base terminals of both transistors are connected to each other through a resistor 24. This resistor 24 can have the same resistance as the resistor 11. This circuit has the advantage over that according to FIG. 1 in that it is suitable for higher line voltages.

It is possible to construct the circuits according to FIGS. 1 and 2 for lower power ratings without the Triac 3. The a-c voltage is then applied to the terminals 19, 20 directly through the load 22. It is also possible to use two antiparallel-connected thyristors instead of the Triac. Instead of the one resistor 21 for the Triac 3, a further resistor 25 must then be inserted and connected to the control terminal of the second thyristor.

There are claimed:

1. Solid-state relay, comprising a full-wave rectifier bridge having a first and a second d-c terminal, a thyristor having the anode thereof connected to said first terminal and the cathode thereof connected to said second terminal, a first transistor having a load circuit and a control terminal, the load circuit of said first transistor being connected to the gate and the cathode of the thyristor, a second transistor having means for supplying a control current thereto and having a load circuit, a Zener diode, a resistor, and a current amplifier having an input and two input terminals, one input terminal being connected through said Zener diode to the control terminal of said first transistor and through said resistor to said first terminal, and the other input terminal being connected to the first terminal, said current amplifier having an output and two output terminals, one output terminal being connected to said first terminal, and the other output terminal being connected through the load circuit of said second transistor to the gate of the thyristor.

2. Solid-state relay according to claim 1, wherein said current amplifier is a further transistor having a base terminal, said base terminal being said one input terminal.

3. Solid-state relay according to claim 1, wherein said current amplifier comprises third and fourth additional transistors having base, collector and emitter terminals and collector-emitter paths, the collector-emitter paths of said additional transistors being connected in series with each other, and including a resistor connected between the base terminals of said additional transistors, the base terminal of said third additional transistor being said one input terminal of said current amplifier, the collector terminal of said third transistor being said one output and said other input of said current amplifier, and the emitter terminal of said fourth transistor being said other output terminal.

4. Solid-state relay according to claim 1, 2 or 3, wherein said second transistor and said supplying means are parts of an opto-electronic coupler.

* * * * *